(12) United States Patent
Chudzik et al.

(10) Patent No.: US 6,770,526 B2
(45) Date of Patent: Aug. 3, 2004

(54) SILICON NITRIDE ISLAND FORMATION FOR INCREASED CAPACITANCE

(75) Inventors: Michael P. Chudzik, Beacon, NY (US); Jochen Beintner, Wappingers Falls, NY (US); Joseph F. Shepard, Jr., Fishkill, NY (US)

(73) Assignees: Infineon Technologies North America Corp., San Jose, CA (US); International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/294,100

(22) Filed: Nov. 14, 2002

(65) Prior Publication Data

US 2004/0095896 A1 May 20, 2004

(51) Int. Cl.⁷ .......................................... H01L 21/8242
(52) U.S. Cl. ...................... 438/243; 438/243; 438/254
(58) Field of Search .................................. 438/243, 386, 438/391, 248, 665; 437/60, 919

(56) References Cited

U.S. PATENT DOCUMENTS

| | | | | |
|---|---|---|---|---|
| 5,384,152 A | * | 1/1995 | Chu et al. | 438/386 |
| 5,679,596 A | * | 10/1997 | Lu | 438/396 |
| 5,877,061 A | * | 3/1999 | Halle et al. | 438/386 |

OTHER PUBLICATIONS

A Cost Effective Embedded DRAM Integration for High Density Memory and High Performance Logic Using 0.15 μm Technology Node and Beyond, Daewon Ha, Dongwon Shin, Gwan–Hyeob Koh, Jaegu Lee, Sanghyeon Lee, Yong–Seok Ahn, Hongsik Jeong, Taeyoung Chung and Kinam Kim, IEEE Transactions on Electron Devices, vol. 47, No. 7, Jul. 2000.

A Stacked Capacitor Technology With ECR Plasma MOCVD (Ba, Sr) $TiO_3$ and $RuO_2/Ru/TiN/TiSi_x$ Storage Nodes for Gb–Scale Dram's, Shintaro Yamamichi, Pierre–Yves Lesaicherre, Hiromu Yamaguchi, Koichi Takemura, Shuji Sone, Hisato Yabuta, Kiyoyuki Sato. Takao Tamura, Ken Makajima, Sadayuki Ohnishi, Ken Tokashiki, Yukihiro Hayashi, Yoshitake Kato, Yoichi Niyasaka, Masaji Yoshida, and Haruhiko Ono, IEEE Transactions on Electron Devices, vol. 44, No. 7, Jul. 1997.

An Iterative Approximation for the Charge–Storage Capacity of MOS Capacitors with an Application to DRAM Trench Capacitor Memory Cells, Reginald J. Perry and John P. Uyemura, IEEE Transactions on Electron Devices, vol. 42, No. 12, Dec. 1995.

Measurements of Leakage Currents and the Capacitance of the Storage Capacitor in a Single DRAM Cell, Jun–ichi Matsuda, IEEE Transactions on Electron Devices, vol. 41, No. 3, Mar. 1994.

(List continued on next page.)

*Primary Examiner*—David Nelms
*Assistant Examiner*—Tinh T Nguyen
(74) *Attorney, Agent, or Firm*—Lerner, David, Littenberg, Krumholz & Mentlik, LLP

(57) ABSTRACT

A semiconductor device is fabricated using a micro-masking structure. The micro-masking structure is formed along the sidewalls of a trench in a semiconductor substrate or along the sidewalls of an electrode disposed over the semiconductor substrate. The micro-masking structure exposes portions of the sidewalls and covers other portions of the sidewalls. Then the exposed portions of the sidewalls are recessed to form a plurality of recesses such that the sidewalls have an increase surface area. After the recessing, the micro-masking structure is removed. The recessed sidewalls provide enhanced capacitance.

25 Claims, 13 Drawing Sheets

OTHER PUBLICATIONS

A Capacitor–Less 1T–DRAM Cell, S. Okhonin, M. Nagoga, J.M. Sallese and P. Fazan, IEEE Electron Device Letters, vol. 23, No. 2, Feb. 2002.

Hemispherical Grained Si Formation on *in–situ* Phosphorous Doped Amorphous–Si Electrode for 256Mb DRAM's Capacitor, Hirohito Watanabe, Yoru Tatsumi, Sadayuki Ohnishi, Hiroshi Kitajima, Ichirou Honma, Taeko Ikarashi and Haruhiko Ono, IEEE Transactions on Electron Devices, vol. 42, No. 7, Jul. 1995.

Fabrication and Performance of Selective HSG Storage Cells for 256 Mb and 1Gb DRAM Applications, Aditi Banerjee, Rick L. Wise, D.L. Plumton, Malcolm Bevan, M.F. Pas, D.L. Crenshaw, Shintaro Aoyama and Majid M. Mansoori, IEEE Transactions on Electron Devices, vol. 47, No. 3, Mar. 2000.

Highly Reliable, High–C, DRAM Storage Capacitors with CVD $Ta_2O_5$ Films on Rugged Polysilicon, G.Q. Lo, Dim–Lee Kwong, Pierre C. Fazan, V.K. Matthews, and Nathan Sandler, IEEE Electron Device Letters, vol. 14. No. 5. May 1993.

A Trench DRAM Gain Cell for High Signal Charge at Reduced Cell Area, W.H. Krautschneider and F. Hofmann, ESSDERC 2001, $31^{st}$ European Solid–State Device Research Conference, Sep. 2001.

New Designs and Materials Tackle 1 Gb Memory Challenge, John Baliga, Semiconductor International, Nov. 2000.

High k Dielectrics for Advanced DRAM Applications, Visweswaren Sivaramakrishnan, Pravin Narwankar, Helen Armer, Patricia Liu, Jun Zhao & Ravi Rajagopalan, Semiconductor Fabtech, 12th Edition, Jul. 2000.

* cited by examiner

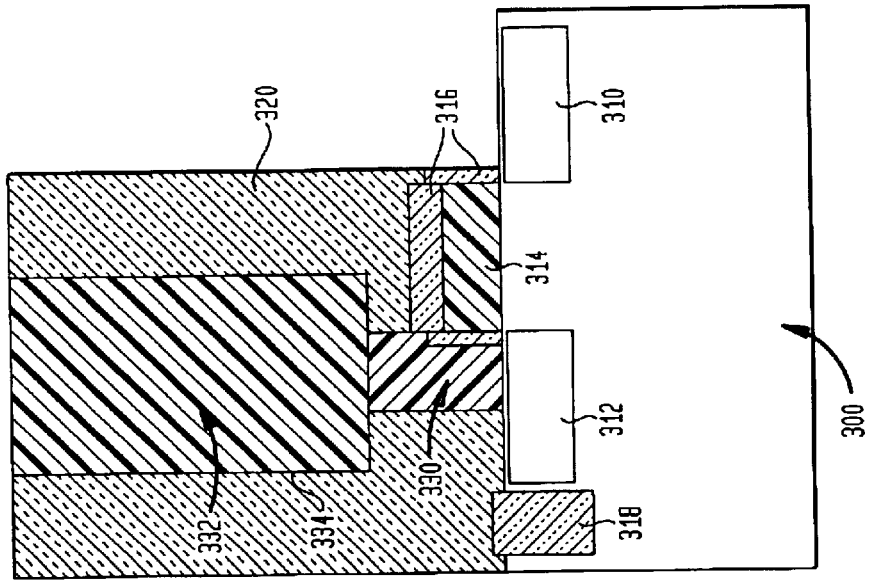
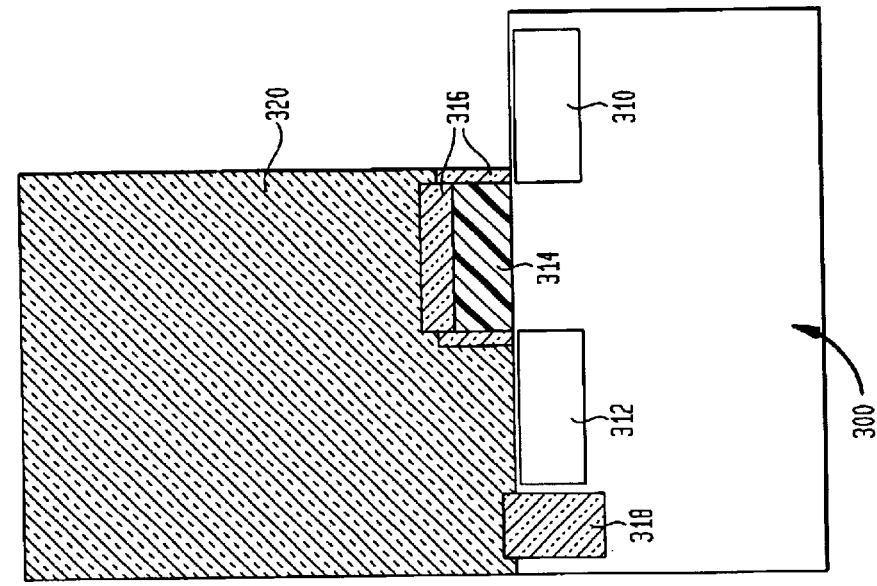

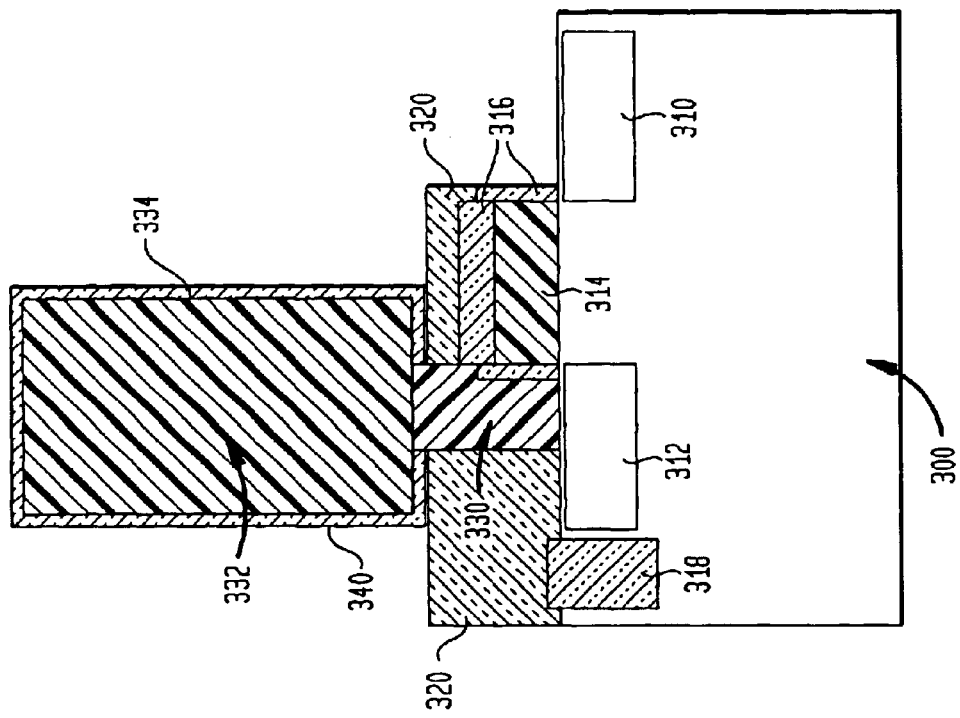
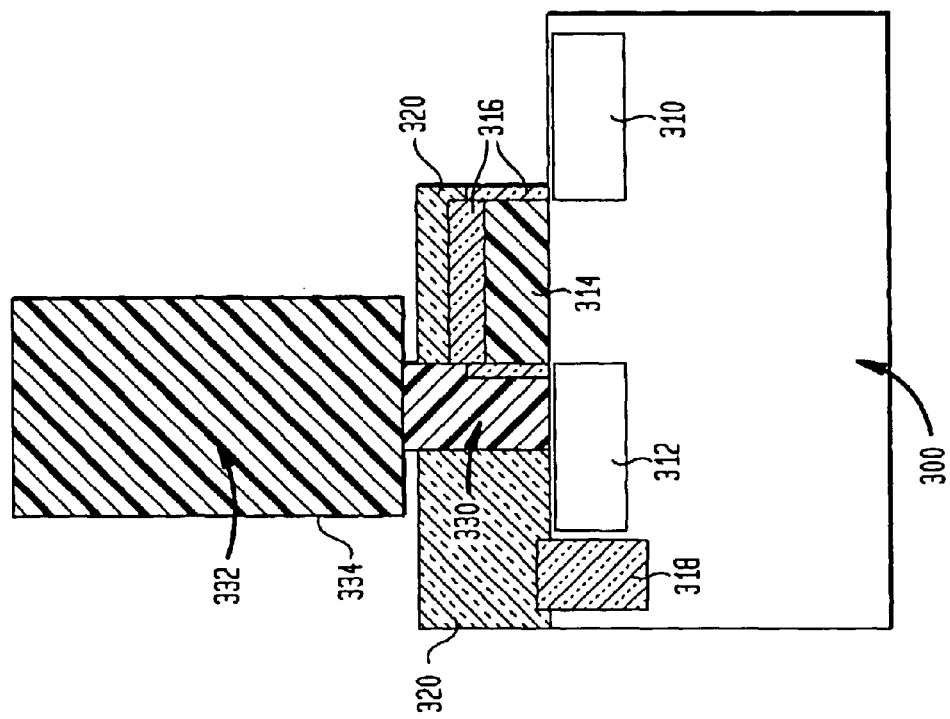

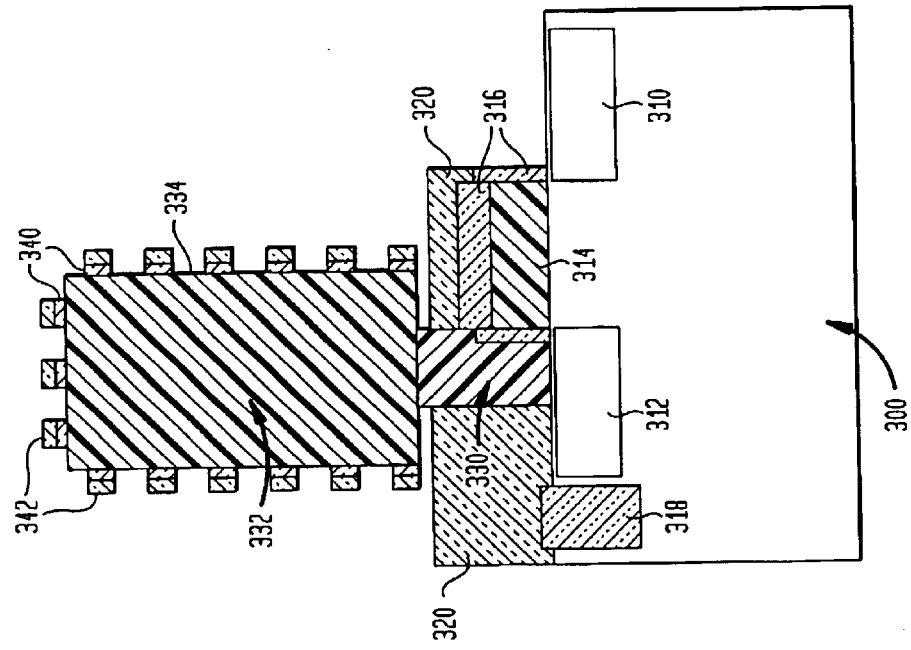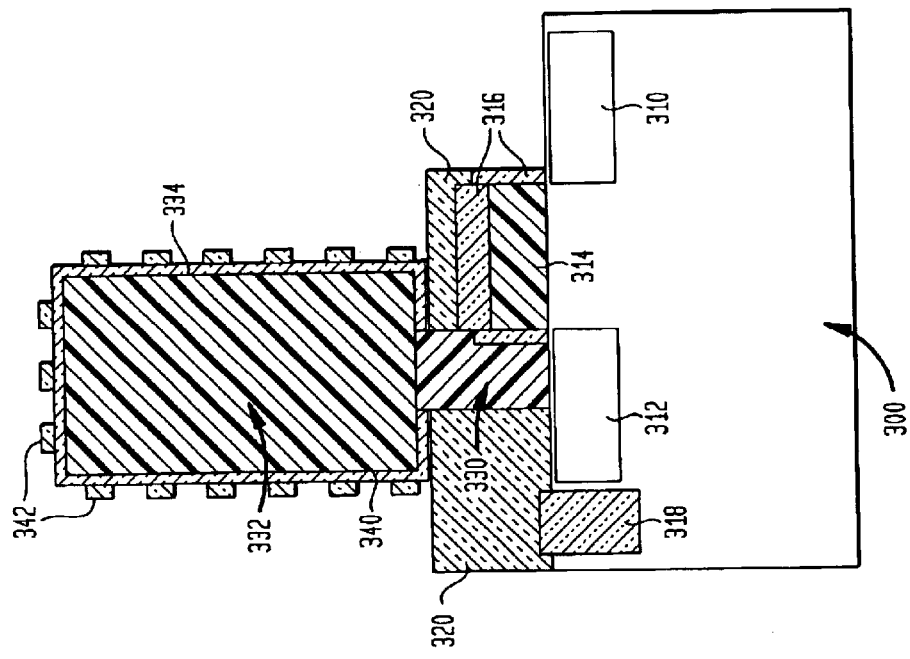

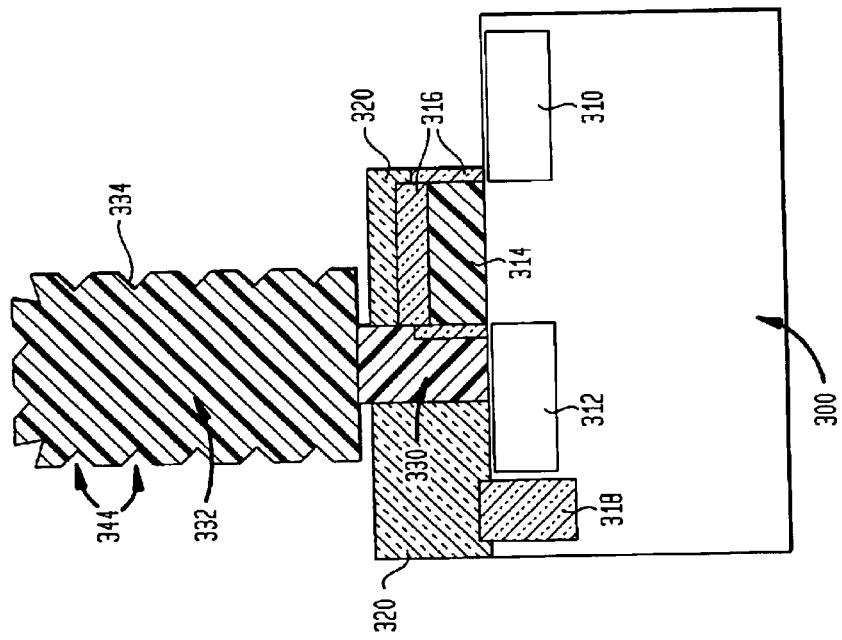
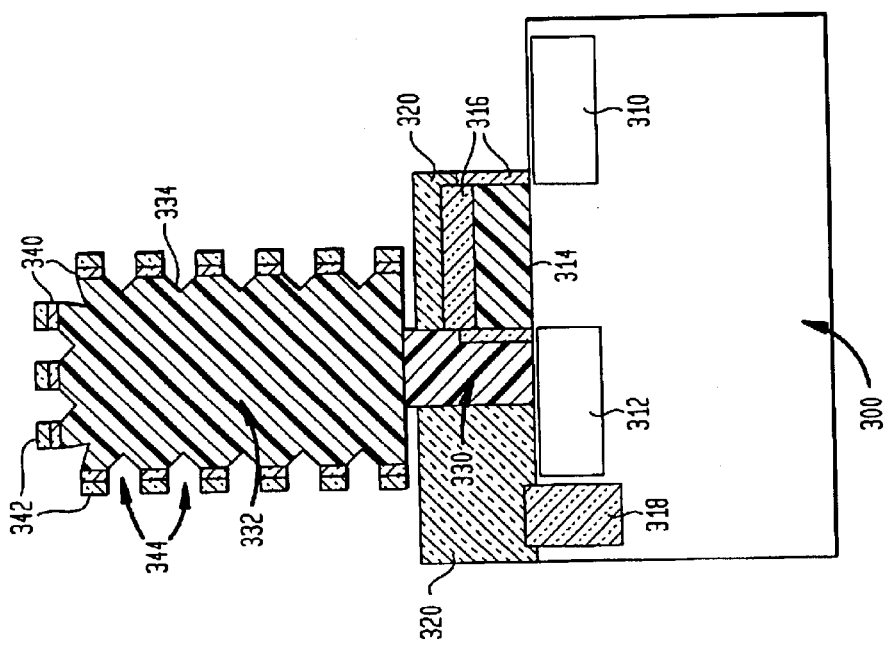

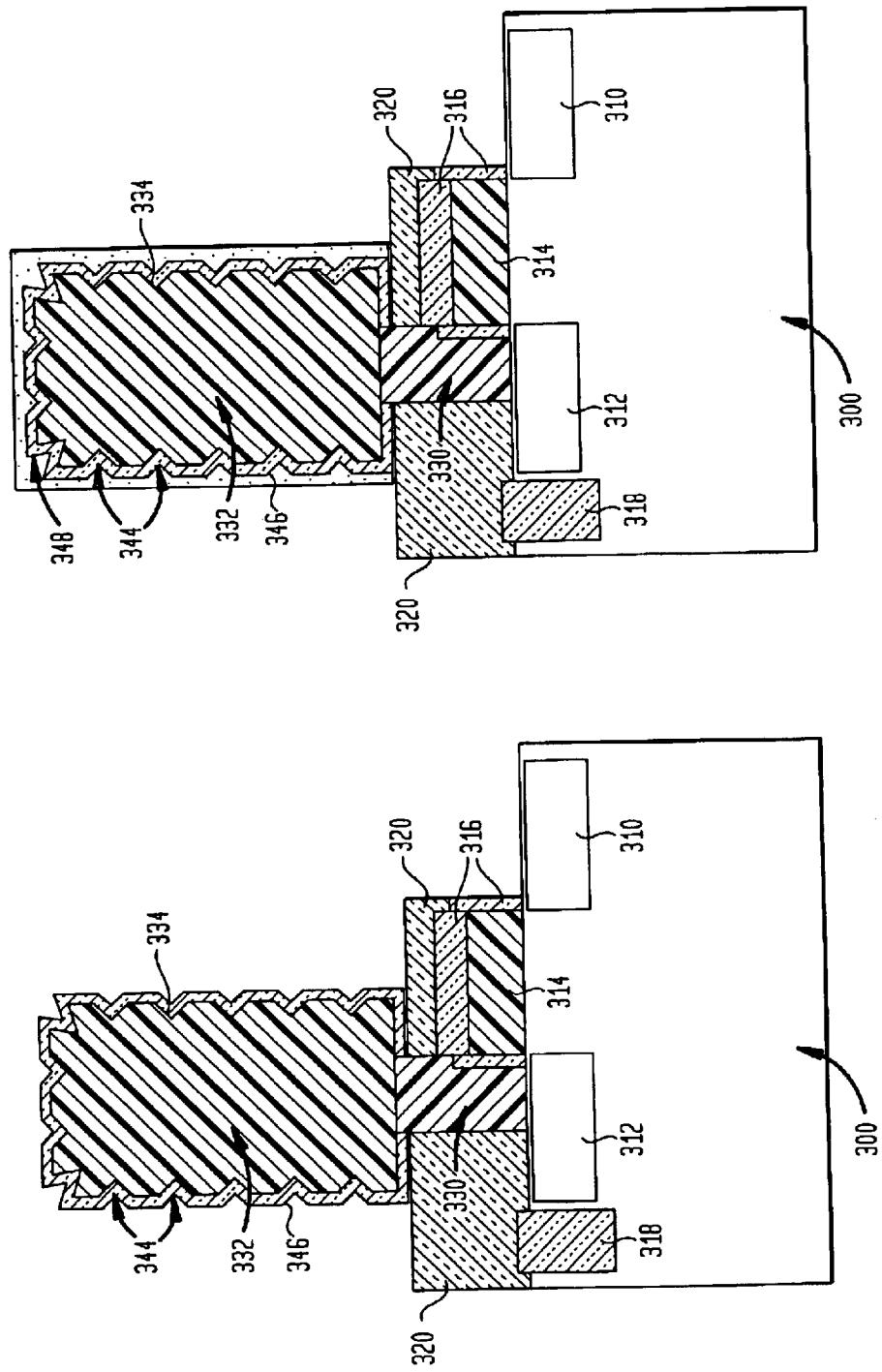

SILICON NITRIDE ISLAND FORMATION FOR INCREASED CAPACITANCE

BACKGROUND OF THE INVENTION

Semiconductor devices are employed in various systems in a wide variety of applications. An important type of semiconductor device used as a memory is known as dynamic random access memory ("DRAM"). The DRAM is extensively used for memory in computers and other electronic devices. A basic DRAM cell may include a capacitor and a transistor each formed in a semiconductor substrate. The capacitor stores a charge to represent a data value. The transistor allows the data value to be refreshed, read from, or written to the capacitor. FIG. 11 illustrates a conventional DRAM memory cell 200 including a capacitor 210 and a transistor 220. The capacitor 210 includes a first electrode 212 and a second electrode 214. The transistor 220 includes a source (or drain) 222 connected to the second electrode 214. The transistor 220 also includes a drain (or source) 224 connected to a bit line 232, as well as a gate 226 connected to a word line 230. The data value may be refreshed, read from or written to the capacitor 210 by applying appropriate voltages to the bit line 232 and/or the word line 230.

A series of DRAM memory cells is typically arranged in an array. More DRAM cells can be fit onto a chip by reducing the size of the capacitor and/or the transistor, thus resulting in greater memory capacity for the chip. One method of minimizing the size of a DRAM cell is to reduce the surface area of the device, which may be accomplished by vertically constructing the components, i.e., where a semiconductor device includes components formed in several layers. One method of performing vertical construction involves stacking layers of material that form the capacitor and/or the transistor on the surface of a semiconductor substrate. An alternative vertical construction method is to form components in a trench in the semiconductor substrate. For example, a dopant may be added to portion of the substrate surrounding the trench in order to form one of the electrodes, the "outer electrode," of the capacitor. A dielectric film may then be deposited along the sidewalls of the trench. Then, polycrystalline silicon, or "polysilicon" (poly-Si) may be deposited on the dielectric film, acting as the second electrode, the "inner electrode" or "storage electrode," of the capacitor. Further processing steps may then be performed in order to finish fabricating the capacitor and other components of the memory cell, e.g., a buried strap connection to the transistor or connections to the bit line or word line of the memory cell.

As the surface area of a memory cell is made smaller and higher DRAM density is achieved, the trench region in which capacitors are formed may be reduced. Thus, the size of the trench typically, but not always, decreases as the memory capacity of the DRAM chip increases. As the size of the DRAM memory cell decreases, the capacitance of the capacitor becomes a critical parameter that can affect memory cell operation. Specifically, the capacitance needs to remain above a certain level in order for the capacitor to store charge effectively. Signal margin and retention time of the memory cell are directly affected by the capacitor's storage ability. In particular, the capacitor may need to maintain a capacitance of at least 25 fF. If the capacitance falls significantly below this level, the charge of the capacitor may dissipate too rapidly and the data value stored by the memory cell may be lost. In order to avoid such a problem, the capacitance is preferably at least 30–35 fF.

Such a capacitance may be achieved through various techniques. In one technique, trenches may be formed relatively deep into the substrate ("deep trenches"), for example between 4–8 $\mu$m below the substrate surface. This will permit the total size of the trench to remain the same, or even increase, when compared to a shallower but wider trench. Deep trenches having a small surface area are typically said to have a high aspect ratio. The "aspect ratio" is the ratio of the depth of a trench compared to the width of the opening at the top of the trench. For example, memory cells fabricated as part of a 256 Mbyte DRAM chip may include capacitor trenches having an aspect ratio of between 10:1 and 20:1. This means that the depth of the trench walls is between 10 and 20 times greater than the width of the trench opening. In higher density DRAM chips, such as chips of 1 Gbyte or more, a typical deep trench aspect ratio may be on the order of 40:1 to 60:1 or higher. In such high aspect ratio situations, the trenches are typically very narrow. The very narrow trenches impact not only the thickness of the fill material of the inner electrode of the capacitor, but also how the fill material is formed in the trench. Thus, in order to properly fabricate a high aspect ratio deep trench capacitor, unconventional materials or processes may be required, which can increase the time and cost of manufacturing.

An alternative technique for increasing the capacitance of the capacitor is to form a "bottle" trench. Typically, a bottle trench is fabricated by first etching a standard trench shape, e.g., a vertical trench, in the semiconductor substrate. Then, the bottle shape may be created by widening a bottom portion of the trench. This may be accomplished by etching or a similar process. The width of the bottle shape may be limited by various parameters or physical dimensions of the memory cell. Therefore, a bottle trench may not be feasible in some situations.

Another technique for increasing capacitance is to fabricate a storage electrode with a "grainy" surface. The grainy surface provides increased surface area and, hence, increased capacitance. Commonly, the grainy storage electrode will comprise a layer of doped poly-Si within a trench or in a stacked structure. A form of poly-Si having a grainy surface is hemispherical grain poly-Si (HSG). Annealing amorphous silicon in an ultra high vacuum condition forms HSG. One drawback of HSG is that in a trench capacitor design the granular structure is constrained by the dimensions of the trench sidewalls. Another drawback to the HSG process is the need for a selective HSG removal step from the collar portion of the DRAM cell. This is typically achieved using a top-down RIE process which suffers from poor recess control and therefore incomplete HSG removal. Remaining HSG grains can provide an electrical short between the buried plate and poly-Si fill, thus rendering the memory cell inoperable. Thus, HSG may be unsuitable for memory cell designs.

SUMMARY OF THE INVENTION

A need exists for improved capacitance in memory cells. A need also exists for methods of forming memory cells having improved capacitance. The present invention provides an capacitor structure having a sufficient capacitance by forming a micro-masking structure in the trench during fabrication.

In accordance with one aspect of the invention, a method of fabricating a semiconductor device is provided. A trench having sidewalls is formed in a semiconductor substrate. The method employs a micro-masking structure to increase the surface area of the sidewalls, which will in turn allow for more storage electrode material, hence a greater capacitance. First, the micro-masking structure is distributed along the sidewalls to expose some portions of the sidewalls while covering other portions of the sidewalls. Next, the exposed portions of the sidewalls are recessed to form a plurality of recesses, giving the sidewalls increased surface area. Finally, the micro-masking structure is removed.

Preferably, the micro-masking structure includes a mask and islands disposed over the mask. The mask may be grown on the sidewalls. The islands may be deposited using a CVD process. The CVD process is preferably an LPCVD process performed at a temperature of between 575° C. to 800° C. for between 1–30 minutes such that the islands are distributed across the mask.

In accordance with another aspect of the invention, a semiconductor device is provided including a semiconductor substrate and a capacitor. The capacitor is formed in the semiconductor substrate, and includes a trench, an outer electrode, a node dielectric and an inner electrode. The trench is defined by sidewalls having an exterior side facing the semiconductor substrate and an interior side remote from the semiconductor substrate. Recesses are formed along the sidewalls to provide increased surface area. The outer electrode substantially surrounds a lower portion of the sidewalls on the exterior side. The node dielectric lines the lower portion of the sidewalls on the interior side, including the recesses. The inner electrode substantially fills the trench.

Preferably, the recesses are formed along the sidewalls by applying a micro-masking structure to the sidewalls and etching portions of the sidewalls not covered by the micro-masking structure. The micro-masking structure preferably includes nitride islands formed over an oxide mask. The nitride islands preferably have a thickness below 40 Å.

In accordance with another aspect of the invention, a method of fabricating a semiconductor device in a semiconductor substrate is provided. A first electrode having sidewalls is formed on top of the semiconductor substrate. A micro-masking structure is then distributed along the sidewalls to expose portions of the sidewalls while covering other portions of the sidewalls. The exposed portions are recessed to form a plurality of recesses such that the sidewalls have an increased surface area. The micro-masking structure is then removed. Next, a dielectric liner is formed over the first electrode, followed by a second electrode being formed over the dielectric liner. The first electrode, the dielectric liner and the second electrode comprise a stacked capacitor.

In accordance with yet another aspect of the invention, a semiconductor device is provided including a semiconductor substrate and a capacitor formed over the semiconductor substrate. The capacitor includes an inner electrode defined by sidewalls, which have a plurality of recesses formed therein. A node dielectric substantially lines the sidewalls, and an outer electrode substantially surrounds the node dielectric. The plurality of recesses provide increased surface area. The recesses are preferably formed using a micro-masking structure including nitride islands formed over an oxide mask. The nitride islands are preferably below 40 Å in thickness. Preferably, the semiconductor device includes a transistor electrically connected to the capacitor, the capacitor being formed over a portion of the transistor in a stacked configuration.

Semiconductor devices of the present invention and methods of fabricating a semiconductor device of the present invention provide capacitor structures having improved capacitance. The foregoing aspects, features and advantages of the present invention will be further appreciated when considered with reference to the following description of the preferred embodiments and accompanying drawings, wherein like reference numerals represent like elements.

BRIEF DESCRIPTION OF THE DRAWINGS

FIG. 12 is a schematic cross-sectional view illustrating a step in a process of fabricating a stacked semiconductor device.

FIG. 13 is a schematic cross-sectional view illustrating the result of another step in a process of forming a stacked semiconductor device of the present invention.

FIG. 14 is a schematic cross-sectional view illustrating a further step in a process of forming a stacked semiconductor device of the present invention.

FIG. 15 is a schematic cross-sectional view illustrating the result of yet another step of forming a stacked semiconductor device of the present invention.

FIG. 16 is a schematic cross-sectional view illustrating the result of a further step of forming a stacked semiconductor device of the present invention.

FIG. 17 is a schematic cross-sectional view illustrating the result of another step of forming a stacked semiconductor device of the present invention.

FIG. 18 is a schematic cross-sectional view illustrating the result of yet another step of forming a stacked semiconductor device of the present invention.

FIG. 19 is a schematic cross-sectional view illustrating the result of a further step of forming a stacked semiconductor device of the present invention.

FIG. 20 is a schematic cross-sectional view illustrating the result of another step of forming a stacked semiconductor device of the present invention.

FIG. 21 is a schematic cross-sectional view illustrating the result of yet another step of forming a stacked semiconductor device of the present invention.

DETAILED DESCRIPTION

In accordance with an embodiment of the present invention, a capacitor with improved capacitance is provided. The fabrication process includes forming islands in a trench and then etching around the islands to increase the dimensions of the trench. The materials and processes described below can be employed with various kinds of substrates, including, but not limited to silicon (Si), gallium arsenide (GaAs), indium phosphide (InP), and silicon carbide (SiC). It is to be appreciated that the numbers used, by way of example only, temperature, pressure, time and dimensions, are approximations and may be varied, and it is obvious to one of ordinary skill in the art that certain steps may be performed in a different order.

Figure 1:
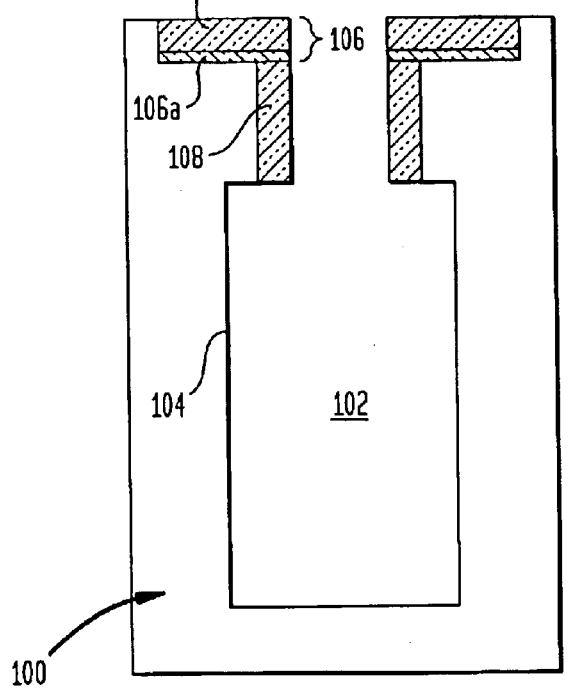
FIG. 1 is a schematic cross-sectional view illustrating a step in a present process of fabricating a semiconductor device having a trench formed therein.

FIG. 1 is a schematic cross-sectional illustration of a trench 102 formed in a semiconductor substrate 100 at one step of the process of fabricating a trench capacitor in accordance with the present invention. The trench 102 is defined by sidewalls 104. As shown in FIG. 1, the trench 102 is bottle-shaped. However, it is to be appreciated that one of ordinary skill in the art of manufacturing trench capacitors may design trenches having different shapes. For instance, the trench 102 may have substantially vertical sidewalls or some other geometric structure. The trench 102 may be formed as follows. A masking layer having an opening may be applied to the surface of the semiconductor substrate 100. Then an etching procedure such as Reactive Ion Etching ("RIE") or an equivalent process is performed to remove substrate material and form the trench 102. RIE is a form of etching that recesses a material by bombarding it with charged particles. RIE is anisotropic, meaning that when recessing a material, RIE will etch more in one direction than another direction. Preferably, a bottle etch is then performed to create the bottle shape. The bottle etch is preferably performed using a "wet etch" of an ammonium hydroxide ($NH_4OH$) solution having a concentration of between 5:1 and 200:1 at a temperature between about 35° C. to 70° C. The pressure is preferably atmospheric. The time of the etch is preferably on the order of 90–180 seconds.

A collar 108 may then be formed over the sidewalls 104 in an upper region of the trench 102. The collar 108 is preferably an oxide that may be grown or deposited on the sidewalls 104. Growth may be performed by a thermal oxidation process. Deposition may be performed by a type of chemical vapor deposition ("CVD") such as low pressure CVD ("LPCVD"). Preferably, the collar 108 is between about 300–400 Å thick. A pad stack 106 is formed on the surface of the semiconductor substrate either before or after the collar 108 is formed. The pad stack 106 may be used in further processing steps.

The pad stack 106 preferably comprises a pad oxide 106a and a pad nitride 106b disposed over the pad oxide 106a. In one process, the pad oxide 106a may be thermally grown on the semiconductor substrate 100. In an alternative process, the pad oxide 106a may be formed by first depositing tetraethylorthosilicate (TEOS) in an LPCVD process and then annealing the TEOS in oxygen, as is known in the art. The pad oxide 106a is preferably on the order of 50 Å thick.

The pad nitride 106b comprises silicon nitride (hereinafter "nitride"), which may be deposited as is known in the art. The pad nitride is preferably on the order of 1000 Å thick.

Figure 2:
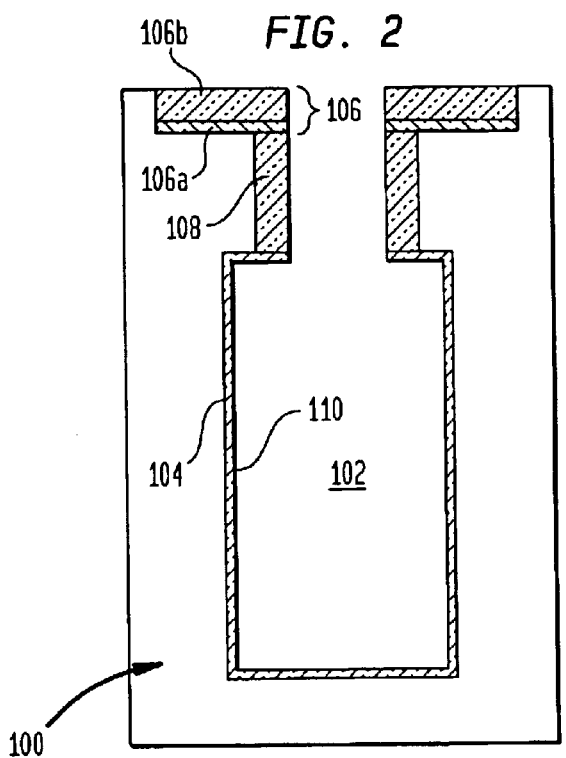
FIG. 2 is a schematic cross-sectional view illustrating the result of another step in a process of forming a semiconductor device of the present invention.

FIG. 2 illustrates the trench 102 after a mask 110 has been formed along the sidewalls 104. The mask 110 may be deposited or grown within the trench 102. Preferably, the mask 110 is an oxide mask that is grown by means of Rapid Thermal Oxidation ("RTO"). The RTO process is typically done in a single wafer processor between 700–1000° C. The time preferably ranges between 5–60 seconds. The mask 110 is preferably between about 20–50 Å thick, or approximately an order of magnitude thinner than the collar 108. The exact thickness may vary depending on the specific process conditions.

Figure 3:
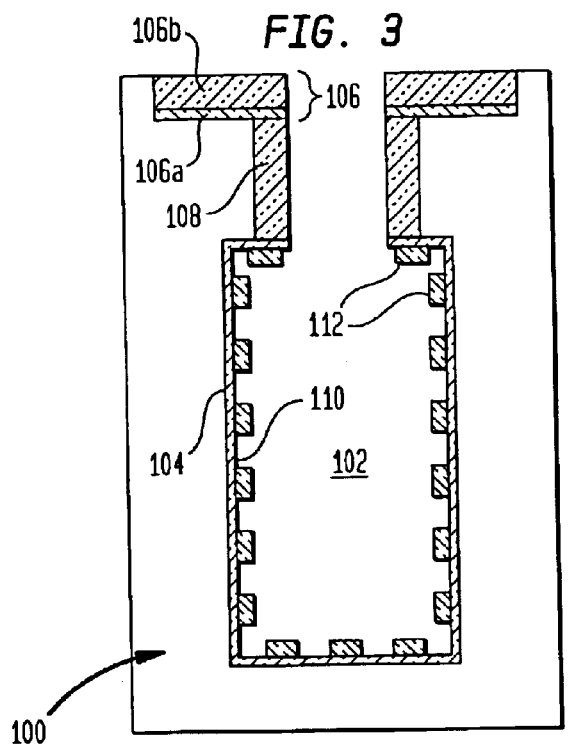
FIG. 3 is a schematic cross-sectional view illustrating a further step in a process of forming a semiconductor device of the present invention.

FIG. 3 illustrates a subsequent step wherein islands 112 are deposited over the mask 110. The islands 112 are preferably nitride deposited using LPCVD. The deposition preferably occurs before any additional processing, e.g., cleaning or smoothing, of the mask 110. The LPCVD deposition preferably occurs at temperatures ranging between 575–800° C. The time preferably ranges from 1 minute to 30 minutes. More preferably, the temperature is between 650° C. and 750° C., and the time is between 5–20 minutes. Typically, the lower the temperature, the longer the time, and the higher the temperature the shorter the time. For example, at 650° C. the process may take 20 minutes, and at 750° C. the process may take 5 minutes. The pressure is preferably 15 mTorr. Such a process, known as "nucleation," forms a series of distributed islands 112 on the mask 110, but not on the collar 108. The islands 112 form because of surface wetting on silicon dioxide and begin to coalesce after about 40 Å into a continuous film. The collar 108 at this point in the process is a disposable collar that is preferably made of $Si_3N_4$. The islands 112 do not form on the collar 108, but do form on the mask 110 because of the surface wetting. The LPCVD process preferably grows the islands 112 such that they are distributed across the mask 110. The islands 112 preferably have a thickness of below about 40 Å, although the actual thickness may be greater or lesser. The nucleation of the islands 112 provides a micro-masking structure, which preferably includes portions of the mask 110. The micro-masking structure will be employed to create further recesses within the trench 102, as will be explained below.

Figure 4:
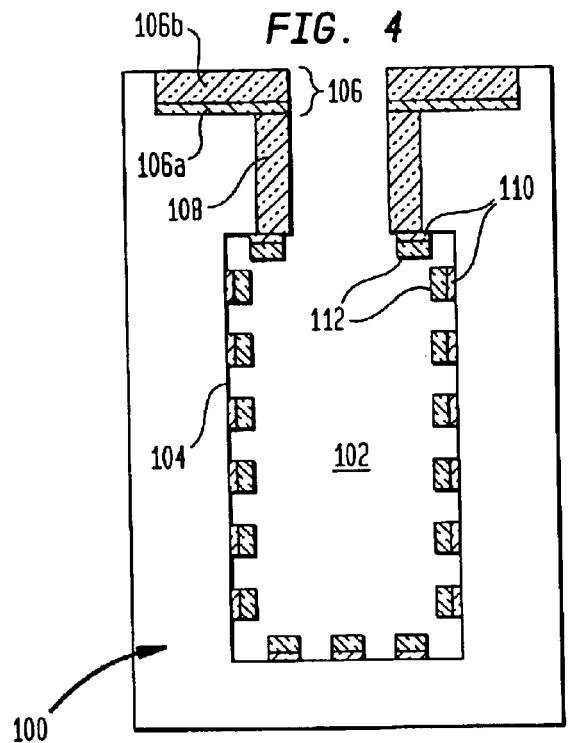
FIG. 4 is a schematic cross-sectional view illustrating the result of yet another step of forming a semiconductor device of the present invention.

FIG. 4 illustrates a further step in the manufacturing process where exposed portions of the mask 110 have been removed. Preferably, the exposed portions of the mask 110 are removed by an etching process using, for example, hydrofluoric acid (HF). The HF etch is a selective process. Selectivity is the ratio of the etch rate of one material as compared to the etch rate of another material. HF is selective to nitride, meaning that the mask 110 comprising oxide is removed more rapidly than the islands 112 comprising nitride. HF containing solutions in $H_2O$ or a buffer in concentrations from 7:1 to 200:1 are preferably used. Room temperature is preferably used.

Figure 5:
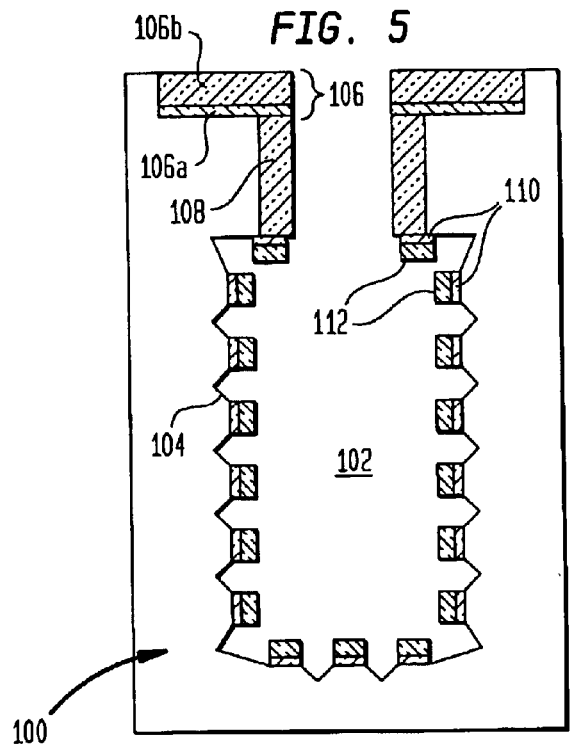
FIG. 5 is a schematic cross-sectional view illustrating the result of another step of forming a semiconductor device of the present invention.

FIG. 5 illustrates the trench 102 after the exposed sidewalls 104 are etched back to form recesses 114. The recesses 114 increase the size of the trench 102, which in turn will increase the amount of material that can be used for the inner electrode of the capacitor, as well as the surface area of the dielectric layer which will cover the inner electrode. Preferably, an etch process employing $NH_4OH$ recesses the sidewalls 104. $NH_4OH$ is selective to oxide and nitride, so the sidewalls 104, which are formed of the same material as the semiconductor substrate 100, will be etched more rapidly than the micro-masking structure. The $NH_4OH$ wet etch is preferably performed using an NH$_4$OH solution having a concentration of between 5:1 and 200:1 (i.e., 1 part NH$_4$OH to 5 (or 200) parts of H$_2$O) at a temperature between about 35° C. to 70° C. The pressure is preferably atmospheric. The time is preferably between 90–180 seconds. The etch rate and etch depth may be controlled by varying one or more of these parameters. An alternative etching process which may be employed is an isotropic plasma etch. Plasma etching is a chemical process that employs gasses and plasma energy to cause a chemical reaction.

Figure 6:
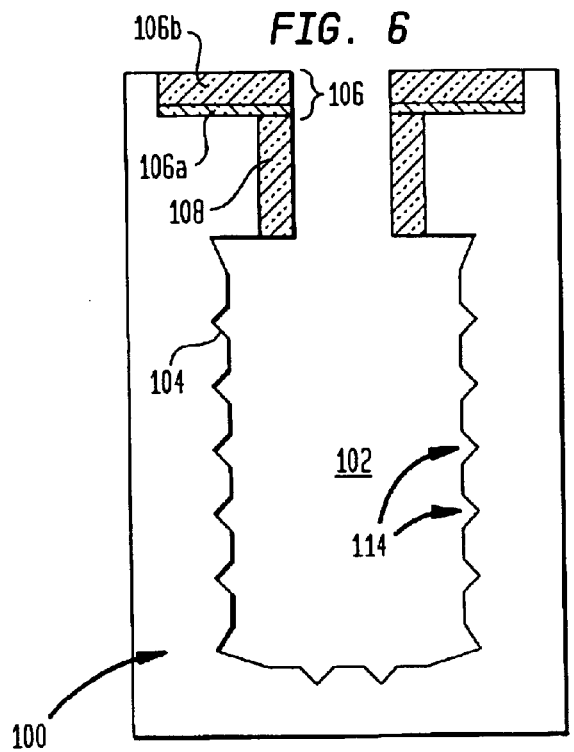
FIG. 6 is a schematic cross-sectional view illustrating the result of a further step of forming a semiconductor device of the present invention.

After the recesses 114 have been formed, the micro-masking structure is removed. The result is illustrated in FIG. 6. The mask 110 and the islands 112 may be removed in one or more stages. Preferably, two stages are used, wherein the islands 112 are first removed by a hot phosphoric acid (H$_3$PO$_4$) etch, followed by removal of the mask 110 using an HF etch. The hot H$_3$PO$_4$ etch preferably takes place at a temperature of between 140–180° C. The time depends on thickness of material to be etched, but in this process approximately 1 minute is preferred. HF containing solutions in H$_2$O or a buffer in concentrations from 7:1 to 200:1 may be used. Typically room temperature is used. In an alternative process, the micro-masking structure is removed in one stage using a combination of HF and ethylene glycol (EG). The HF/EG process is preferably performed using an HF/EG solution having a concentration of between 5:1 and 20:1 at a temperature of approximately 80° C. The pressure is preferably atmospheric and the times preferably vary between 5–60 seconds.

Figure 7:
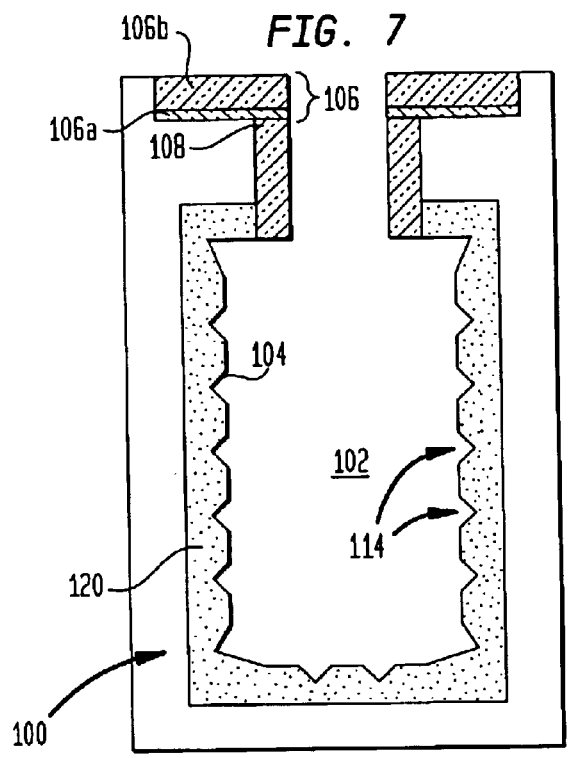
FIG. 7 is a schematic cross-sectional view illustrating a further step in a process of forming a semiconductor device of the present invention.

FIG. 7 illustrates a subsequent step in the process of manufacturing a trench capacitor. At this stage the outer electrode 120 of the capacitor, also known as a "buried plate," is formed around the trench 102. Doping the semiconductor substrate 100 around the trench 102 with a dopant creates the outer electrode 120. Preferably, the dopant in an n-type semiconductor is arsenic, although other materials such as antimony or phosphorous may be used. Boron is typically used to dope a p-type substrate. In a preferred embodiment, the arsenic is provided as a gas and diffuses into the semiconductor substrate 100 at a concentration of between about $1\times10^{19}$ and $1\times10^{20}$ atoms per cm$^3$. More preferably, the dopant concentration is as high as possible subject to manufacturing limitations.

Figure 8:
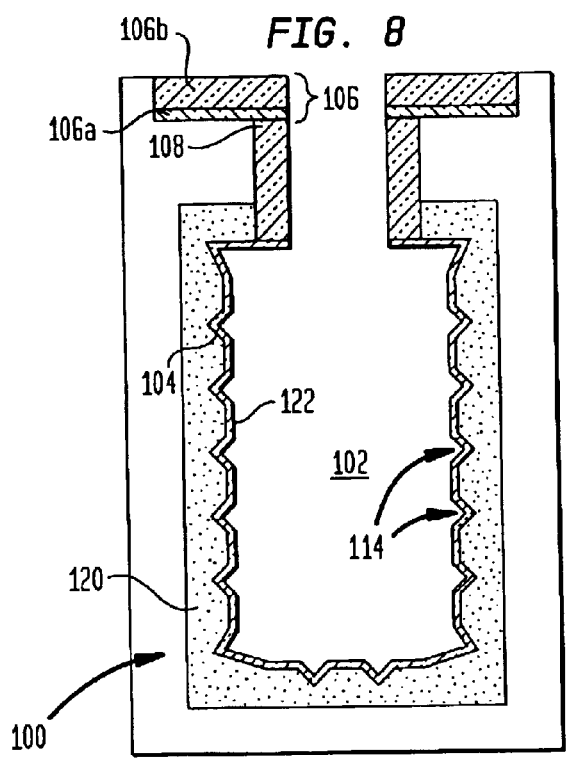
FIG. 8 is a schematic cross-sectional view illustrating another step in a process of forming a semiconductor device of the present invention.

After the outer electrode 120 is formed, a dielectric liner, the "node dielectric" 122, is formed along the sidewalls 104 in the portion of the trench below the collar 108. FIG. 8 shows the node dielectric 122 disposed within the trench 102. The node dielectric 122 may be any suitable material having a high dielectric constant, i.e., "high K." As used herein, "high K" materials have a dielectric constant greater than silicon dioxide (SiO$_2$), which has a dielectric constant of about 3.9.

One preferred dielectric material is tantalum pentoxide (Ta$_2$O$_5$), which has a dielectric constant of between 25–50. Other suitable dielectric materials include SiN, having a dielectric constant of about 7; titanium oxide (TiO$_2$), having a dielectric constant of between about 30–40; zirconium oxide (ZrO$_2$), having a dielectric constant of between about 14–28; strontium titanate (SrTiO$_3$), having a dielectric constant of approximately 230; and barium-strontium-titanate (BST), having a dielectric constant between about 320–800. Additional dielectric materials may be employed besides those enumerated herein. The node dielectric 122 may be formed of one or more layers of material, such as an oxide-nitride-oxide (ONO) combination, which may have a dielectric constant of about 7. The process for forming the node dielectric 122 depends on the materials used. By way of example only, Ta$_2$O$_5$, TiO$_2$ and ZrO$_2$ may be formed using metal oxide CVD ("MOCVD"), BST and SrTiO$_3$ may be formed using a combination of MOCVD and molecular beam epitaxy ("MBE"), and ONO may be formed using a combination of oxidation and CVD, as is known in the art.

Figure 9:
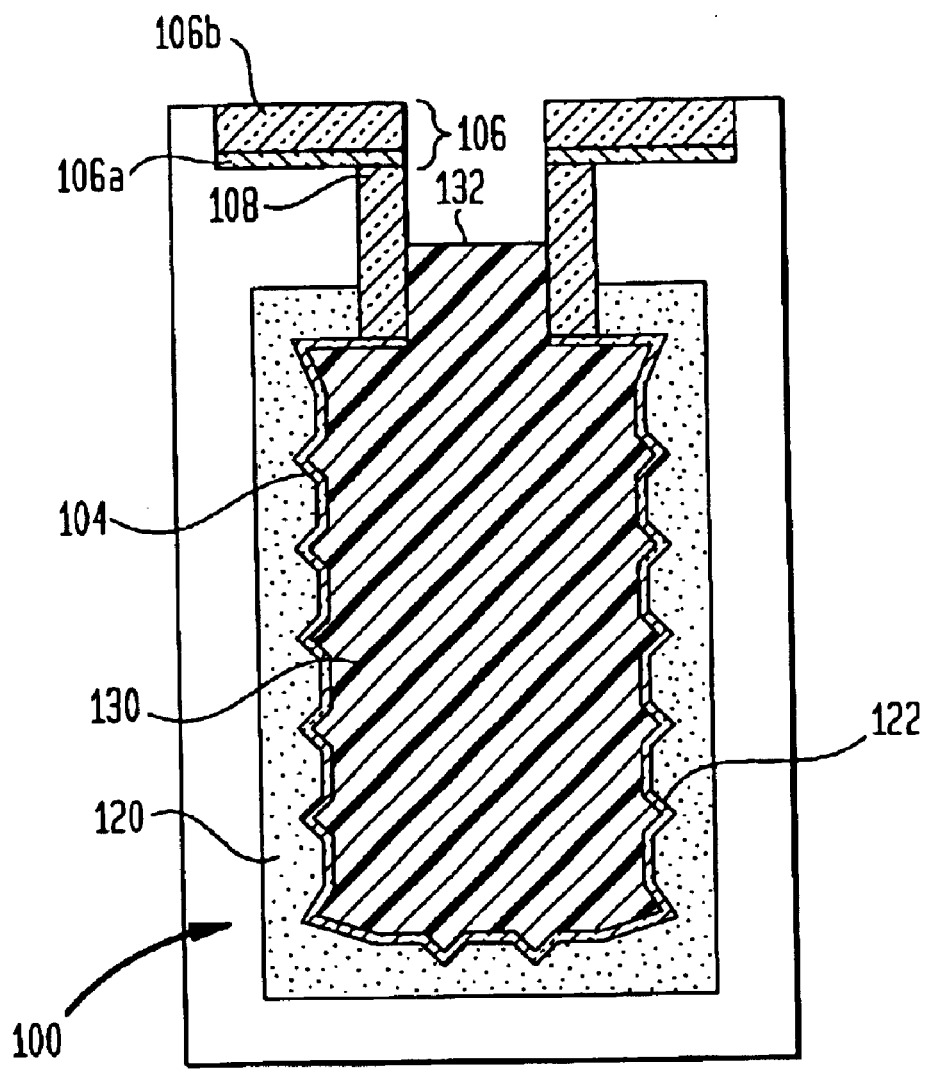
FIG. 9 is a schematic cross-sectional view illustrating yet another step in a process of forming a semiconductor device of the present invention.

After formation of the node dielectric 122, the inner electrode may be created by substantially filling the trench 102 with a capacitor fill material 130 having a top surface 132, as shown in FIG. 9. The capacitor fill material 130 is preferably poly-Si doped with arsenic. The capacitor fill material may be formed as follows. First, the trench is filled with poly-Si using LPCVD or a similar process. Then the arsenic is provided as a gas and diffuses into the poly-Si at a concentration of between about $1\times10^{19}$ and $1\times10^{20}$ atoms per cm$^3$. More preferably, the arsenic concentration is as high as possible, subject to manufacturing limitations. Alternatively, the poly-Si may be in situ doped with the arsenic. By way of example only, such in situ doping may be performed using a mixture of silane (SiH$_4$) and arsine (AsH$_3$) gases flowed simultaneously over the trench 102 at a deposition temperature of between about 400° C. and 700° C. and a pressure of between 100 to 1000 Torr.

Figure 10:
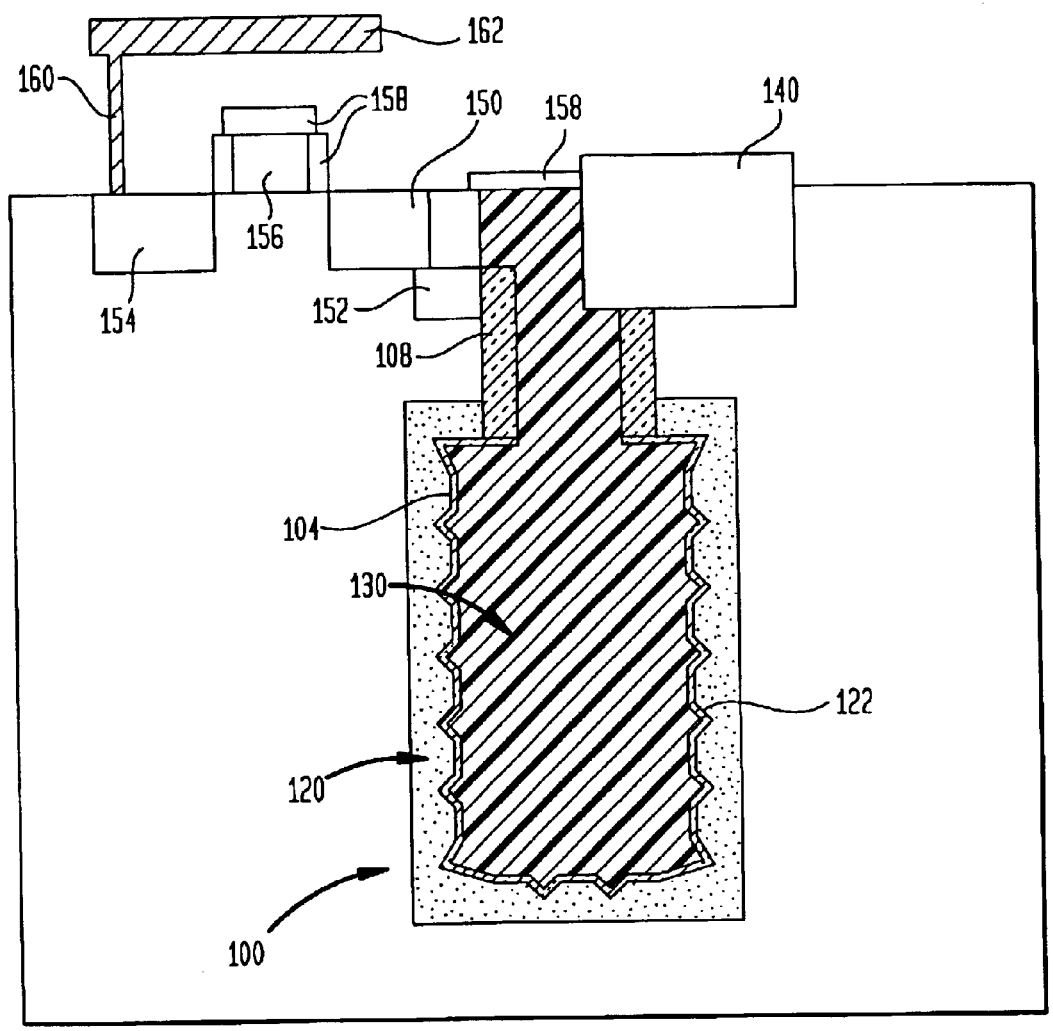
FIG. 10 is a schematic cross-sectional view illustrating a DRAM memory cell in accordance with aspects of the present invention.
Figure 11:
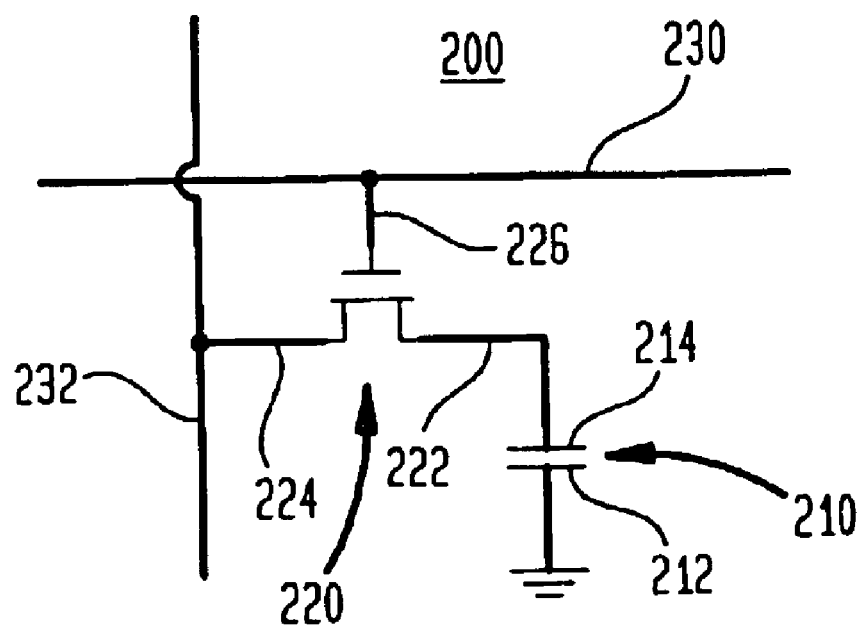
FIG. 11 depicts a conventional DRAM memory cell.

Upon completion of the trench capacitor, a transistor and accompanying connections may be formed on the semiconductor substrate 100 in order to fabricate a DRAM memory cell. FIG. 10 illustrates the semiconductor substrate 100 after the transistor is formed. Specifically, the figure shows a drain 150 and buried strap contact 152 adjacent to one side of the capacitor fill material 130. A source 154 and a gate conductor/word line 156 complete the transistor. On the other side of the capacitor fill material 130 is shallow trench isolation ("STI") 140, which serves to electrically isolate the memory cell from adjacent memory cells in the semiconductor substrate 100. The source 154 is connected to a bit line 162 through a bit line contact 160. Spacers 158 provides isolation to the capacitor and to the gate conductor/word line 156. The transistor of FIG. 10 is planar, but a vertical or other transistor design may be used.

While the enhanced capacitor design of the present invention is illustrated as a trench capacitor, the invention may also be used in a stacked capacitor design. In accordance with another embodiment of the present invention, a capacitor with enhanced capacitance is provided in a stacked configuration. The fabrication process includes forming an inner electrode and processing the inner electrode to provide increased surface area. As with the trench structure of FIGS. 1–10, the materials and processes described below may be employed with various kinds of substrates. Furthermore, the numbers used are approximations and may be varied, and certain steps may be performed in a different order.

FIG. 12 is a schematic cross-sectional illustration of a semiconductor substrate 300 at one step of the process of fabricating a stacked semiconductor device. Prior to the formation of a stacked capacitor, a transistor is preferably formed on the semiconductor substrate 300. The transistor includes a source 310, a drain 312 and a gate conductor/word line 314. Spacers 316, which are preferably oxide spacers, may isolate the gate conductor/word line 314. STI 318 isolates the stacked semiconductor device from adjacent devices in the semiconductor substrate 300. The source 310, the drain 312, the gate conductor/word line 314, the spacers 316 and the STI 318 may be formed using known processes. Next, a buffer 320 may be deposited over the substrate 300, substantially covering the drain 312, the gate conductor/word line 314, the spacers 316 and the STI 318. The buffer 320 is preferably boro-phospho-silicate glass (BPSG).

FIG. 13 illustrates the result of a subsequent step after the buffer 320 is etched to create a trench which is then filled with an inner electrode. The trench may be formed in multiple stages. For example, a narrow, deep trench may first be etched, followed by a wider, shallower trench. The trench formation process is preferably performed using RIE. The inner electrode preferably comprises a stem 330 and a body 332 each having sidewalls 334. The stem 330 and the body 332 may be formed in one or more stages. Preferably, the stem 330 and the body 332 both comprise doped poly-Si. The dopant is preferably arsenic having a concentration of at least $1 \times 10^{19}$ atoms per $cm^3$. Alternatively, titanium nitride (TiN) or another suitable material may be used.

FIG. 14 illustrates the result of a subsequent step after the buffer 320 has been recessed below the body 332 of the inner electrode. RIE may be used to recess the buffer 320.

FIG. 15 illustrates the stacked semiconductor device after a mask 340 is formed over the sidewalls 334 of the body 332 of the inner electrode. As with the mask 110 (FIG. 2), the mask 340 may be deposited or grown over the sidewalls 334. Preferably, the mask 340 is an oxide mask that is grown by a thermal oxidation process such as RTO. The mask 340 is preferably on the order of 20–30 Å thick. The exact thickness may be larger or smaller than this range depending upon the process conditions.

FIG. 16 illustrates a subsequent step wherein islands 342 are deposited over the mask 340. As with the islands 112 (FIG. 3), the islands 342 are preferably nitride, which are deposited using LPCVD within a temperature range of approximately 575° C. to 800° C. for between 1 to 30 minutes. More preferably, the LPCVD process occurs at a temperature of between 650° C. and 750° C. and a pressure of 15 mTorr for between 5 to 20 minutes. Typically, the lower the temperature the longer the time, and the higher the temperature the shorter the time. The deposition preferably occurs before any additional processing, e.g., cleaning or smoothing, of the mask 340. As described above with reference to FIG. 3, the LPCVD process preferably grows the islands 342 such that they are distributed across the mask 340. The islands 342 may be less than about 40 Å, and preferably have a thickness between about 20–30 Å. The thickness may be higher or lower depending on process conditions. The nucleation of the islands 342 provides a micro-masking structure, which preferably includes portions of the mask 340.

FIG. 17 illustrates the results of a further step in the manufacturing process where portions of the mask 340 not covered by the islands 342 have been removed. Preferably, an etching process using, for example, HF, removes the exposed portions of the mask 340. The HF etch preferably occurs at the same process parameters as the HF etch described with relation to FIG. 4.

FIG. 18 illustrates the results of another step after the sidewalls 334 exposed by the HF etch are recessed. Recesses 344 are formed in the sidewalls 334, increasing the surface area of the body 332 of the inner electrode. The increased surface area will provide an increase in the capacitance of a stacked capacitor of the present invention as compared to a stacked capacitor without the recesses 344. Recessing is preferably accomplished by applying a solution of $NH_4OH$ having a concentration of between 5:1 and 200:1 and a temperature between about 35° C. and 70° C. for approximately 1–2 minutes. The etch rate and depth may be controlled by varying one or more of these parameters.

After the recesses 344 have been formed, the micro-masking structure is removed. The result is illustrated in FIG. 19. The mask 340 and the islands 342 may be removed in one or more stages. Preferably, two stages are used, wherein the islands 342 are first removed by a hot $H_3PO_4$ etch, followed by removal of the mask 340 using an HF etch. The $H_3PO_4$ etch and the HF etch preferably take place at the same process parameters as the etches described with relation to FIG. 6. In an alternative process, the micro-masking structure is removed in one stage using an HF/EG combination. The HF/EG solution preferably has a concentration of between 5:1 and 20:1 and a temperature of approximately 80° C. The temperature and pressure of the process are preferably the same as described with respect to FIG. 6.

FIG. 20 illustrates a subsequent step in the process of manufacturing a stacked capacitor. At this stage, a node dielectric 346 is formed along the sidewalls 334. The node dielectric 346 may be any suitable high K material as discussed above with reference to the node dielectric 122 (FIG. 8). Node dielectric 346 formation may be performed in the same manner as forming the node dielectric 122.

An outer electrode 348 is then formed over the node dielectric 346, as shown in FIG. 21. The outer electrode 348 preferably comprises poly-Si doped with arsenic, wherein the arsenic is at a concentration of at least $1 \times 10^{19}$ atoms per $cm^3$. Alternatively, other materials and dopants may be used for the outer electrode 348 as well as the stem 330 and the body 332 of the inner electrode. By way of example only, TiN may be used.

Figure 22:
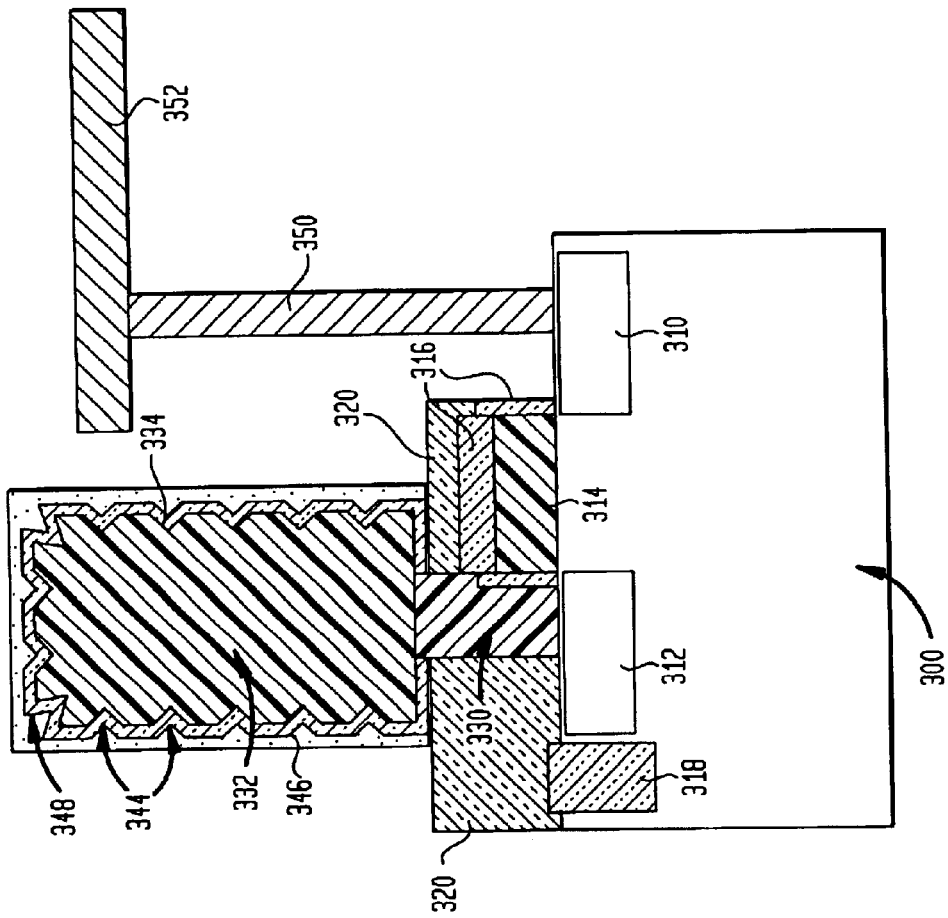
FIG. 22 is a schematic cross-sectional view illustrating the result of a further step of forming a stacked semiconductor device of the present invention.

FIG. 22 illustrates the result of a further processing step after additional connections to the transistor have been formed. The source 310 is connected to a bit line 352 through a bit line contact 350, as is known in the art. The bit line 352 and the bit line contact 350 are typically formed from a metal such as tungsten. As shown in FIG. 22, the stacked capacitor is formed over the transistor, but other structural configurations are possible.

One advantage of the present invention is that the micro-masking structure can be used in any trench structure or aspect ratio to provide enhanced capacitance. Another advantage of the present invention is that conventional node dielectric and storage electrode materials can be employed, avoiding expensive materials and processing. Yet another advantage of the present invention is that capacitors can be fabricated with a capacitance in excess of 25 fF, ensuring sufficient signal margin and retention time. The present process also circumvents problems of HSG by removing the need for a Recess RIE process. The area-enhancement of the present invention may be achieved by etching into the silicon and not by adding conductive silicon, thus removing the possibility of a short. The islands are removed from the collar region during the area enhancement etchback process. In addition, if the islands are formed of $Si_3N_4$ and were to remain on the collar region, it would not short circuit the memory cell because $Si_3N_4$ is itself an insulator.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claim.

What is claimed is:

1. A method of fabricating a semiconductor device comprising:
   (a) forming a trench having sidewalls in a semiconductor substrate;
   (b) distributing a micro-masking structure along the sidewalls to expose portions of the sidewalls while covering other portions of the sidewalls;

(c) recessing the exposed portions of the sidewalls to form a plurality of recesses such that the sidewalls have an increased surface area; and (d) removing the micro-masking structure.

2. The method of claim 1, wherein the micro-masking structure includes a mask and islands disposed over the mask.

3. The method of claim 2, wherein the mask is grown on the sidewalls and the islands are deposited using a CVD process.

4. The method of claim 3, wherein the CVD process is an LPCVD process performed at a temperature between 575° C. to 800° C. for between 1 to 30 minutes, such that the islands are distributed across the mask.

5. The method of claim 3, wherein removing the micro-masking structure includes removing the islands with an $H_3PO_4$ etch and removing the mask with an HF etch.

6. A method of fabricating a semiconductor device comprising:

(a) forming a trench having sidewalls in a semiconductor substrate;

(b) forming an oxide collar over an upper region of the sidewalls;

(c) forming an oxide mask over a lower region of the sidewalls;

(d) depositing a plurality of nitride islands over the oxide mask;

(e) removing a portion of the oxide mask not covered by the plurality of nitride islands to expose areas of the lower region of the sidewalls;

(f) recessing the exposed areas of the lower region of the sidewalls;

(g) removing the plurality of nitride islands; and (h) removing the oxide mask.

7. The method of claim 6, wherein the oxide mask is grown by rapid thermal oxidation.

8. The method of claim 6, wherein the oxide mask is deposited.

9. The method of claim 6, wherein removing the plurality of nitride islands is performed using a hot $H_3PO_4$ etch and removing the oxide mask is performed using an HF etch.

10. The method of claim 6, wherein removing the plurality of nitride islands and removing the oxide mask are performed together using a combination of HF and EG.

11. The method of claim 6, wherein depositing the plurality of nitride islands is performed at a temperature of between 650° C.–750° C. and a pressure of 15 mTorr for between 5–20 minutes.

12. The method of claim 6, wherein the plurality of nitride islands have a thickness below 40 Å.

13. The method of claim 12, wherein the plurality of nitride islands are distributed across the oxide mask.

14. A method of fabricating a semiconductor device comprising:

(a) forming a first electrode having sidewalls on top of a semiconductor substrate; (b) distributing a micro-masking structure along the sidewalls to expose portions of the sidewalls while covering other portions of the sidewalls, the micro-masking structure including a mask and insulating islands disposed over the mask;

(c) recessing the exposed portions of the sidewalls to form a plurality of recesses such that the sidewalls have an increased surface area;

(d) removing the micro-masking structure;

(e) forming a dielectric liner over the first electrode; and (f) forming a second electrode over the dielectric liner.

15. The method of claim 14, wherein the insulating islands comprise a nitride.

16. The method of claim 15, wherein the mask is grown on the sidewalls and the islands are deposited using a CVD process.

17. The method of claim 16, wherein the CVD process is an LPCVD process performed at a temperature between 575° C. to 800° C. for between 1 to 30 minutes, such that the islands are distributed across the mask.

18. The method of claim 17, wherein the temperature is between 650° C.–750° C., the time is between 5 to 20 minutes, and the LPCVD process is performed at a pressure of 15 mTorr.

19. The method of claim 16, wherein removing the micro-masking structure includes removing the islands with an $H_3PO_4$ etch and removing the mask with an HF etch.

20. A method of fabricating a semiconductor device comprising:

(a) depositing a buffer over a semiconductor substrate;

(b) selectively removing a portion of the buffer to form a trench;

(c) substantially filling the trench with an inner electrode having sidewalls adjacent to the trench;

(d) recessing the buffer below a first portion of the inner electrode;

(e) forming an oxide mask over the sidewalls;

(f) depositing a plurality of nitride islands over the oxide mask;

(g) removing a portion of the oxide mask not covered by the plurality of nitride islands to expose areas of the sidewalls;

(h) recessing the exposed areas of the sidewalls;

(i) removing the plurality of nitride islands;

(j) removing the oxide mask;

(k) forming a dielectric liner over the inner electrode; and (l) forming an outer electrode over the dielectric liner.

21. The method of claim 20, wherein the oxide mask is grown by rapid thermal oxidation.

22. The method of claim 20, wherein the oxide mask is deposited.

23. The method of claim 20, wherein removing the plurality of nitride islands is performed using a hot $H_3PO_4$ etch and removing the oxide mask is performed using an HF etch.

24. The method of claim 20, wherein removing the plurality of nitride islands and removing the oxide mask are performed using a, solution of HF and EG having a concentration of between 5:1 and 20:1 at a temperature of about 80° C.

25. The method of claim 24, wherein the plurality of nitride islands have a thickness below 40 Å.

* * * * *

UNITED STATES PATENT AND TRADEMARK OFFICE
CERTIFICATE OF CORRECTION

PATENT NO.   : 6,770,526 B2
DATED        : August 3, 2004
INVENTOR(S)  : Michael P. Chudzik, Jochen Beintner and Joseph F. Shepard Jr.

It is certified that error appears in the above-identified patent and that said Letters Patent is hereby corrected as shown below:

Column 10,
Line 59, "claim" should read -- claims --.

Column 12,
Line 56, cancel the comma "," after the first occurrence of "a".

Signed and Sealed this

First Day of February, 2005

JON W. DUDAS
*Director of the United States Patent and Trademark Office*